United States Patent
Zhao

(10) Patent No.: US 12,130,558 B2
(45) Date of Patent: Oct. 29, 2024

(54) RADIATION SYSTEM FOR CONTROLLING BURSTS OF PULSES OF RADIATION

(71) Applicant: Cymer, LLC, San Diego, CA (US)

(72) Inventor: Yingbo Zhao, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 167 days.

(21) Appl. No.: 17/774,531

(22) PCT Filed: Oct. 27, 2020

(86) PCT No.: PCT/US2020/057570
§ 371 (c)(1),
(2) Date: May 5, 2022

(87) PCT Pub. No.: WO2021/091730
PCT Pub. Date: May 14, 2021

(65) Prior Publication Data
US 2022/0390857 A1  Dec. 8, 2022

Related U.S. Application Data

(60) Provisional application No. 62/933,140, filed on Nov. 8, 2019.

(51) Int. Cl.
*G03F 7/00* (2006.01)
*H01S 3/00* (2006.01)
(Continued)

(52) U.S. Cl.
CPC ...... *G03F 7/70575* (2013.01); *G03F 7/70025* (2013.01); *G03F 7/70041* (2013.01);
(Continued)

(58) Field of Classification Search
CPC ............ G03F 7/70575; G03F 7/70025; G03F 7/70041; G03F 7/705; H01S 3/1305;
(Continued)

(56) References Cited

U.S. PATENT DOCUMENTS 6,078,599 A * 6/2000 Everage ............... G03F 7/70575
372/20
6,952,253 B2  10/2005  Lof et al.
(Continued)

FOREIGN PATENT DOCUMENTS

JP  H11214783 A  8/1999
JP  2001244531 A  9/2001
(Continued)

OTHER PUBLICATIONS

Japanese Patent Office, Office Action, counterpart Japanese Patent Application No. 2022-523484, mailed May 25, 2023, 10 pages total (including English translation of 5 pages).
(Continued)

*Primary Examiner* — Deoram Persaud
(74) *Attorney, Agent, or Firm* — DiBerardino McGovern IP Group LLC

(57) ABSTRACT

A radiation system for controlling bursts of pulses of radiation comprises: an optical element; a controller; an actuator; and a sensor. The optical element is configured to interact with the pulses of radiation to control a characteristic of the pulses of radiation, the characteristic of the pulses of radiation being dependent on a configuration of the optical element. The controller is operable to generate a control signal. The actuator is configured to receive the control signal from the controller and to control a configuration of the optical element in dependence on the control signal. The sensor is operable to determine the characteristic of pulses having interacted with the optical element. The control signal for a given pulse in a given burst is dependent on the determined characteristic of a corresponding pulse from a previous burst.

17 Claims, 7 Drawing Sheets

(51) Int. Cl.
  *H01S 3/10* (2006.01)
  *H01S 3/1055* (2006.01)
  *H01S 3/23* (2006.01)

(52) U.S. Cl.
  CPC ...... *H01S 3/10038* (2013.01); *H01S 3/10069* (2013.01); *H01S 3/1055* (2013.01); *H01S 3/0014* (2013.01); *H01S 3/2308* (2013.01)

(58) Field of Classification Search
  CPC .. H01S 3/137; H01S 3/10046; H01S 3/10069; H01S 3/1055; H01S 3/2308; H01S 3/0971; H01S 3/08004; H01S 3/225; H01S 3/10038; H01S 3/0014
  See application file for complete search history.

(56) References Cited

U.S. PATENT DOCUMENTS

| | | | |
|---|---|---|---|
| 2006/0114957 A1 | 6/2006 | Algots et al. | |
| 2011/0019705 A1* | 1/2011 | Adams | H01S 3/13013 359/341.1 |
| 2013/0170508 A1 | 7/2013 | Suzuki et al. | |
| 2014/0104614 A1 | 4/2014 | Rokitski et al. | |
| 2016/0161859 A1* | 6/2016 | Ahlawat | H01S 3/2256 355/67 |
| 2016/0299441 A1 | 10/2016 | Ahlawat | |
| 2017/0279241 A1* | 9/2017 | Onose | H01S 3/0912 |
| 2018/0107017 A1 | 4/2018 | Mason | |
| 2021/0364885 A1* | 11/2021 | Bauerschmidt | G03F 9/7065 |
| 2022/0269181 A1* | 8/2022 | Teng | H01S 3/10046 |

FOREIGN PATENT DOCUMENTS

| | | |
|---|---|---|
| JP | 2018517278 A | 6/2018 |
| WO | 2019190700 A1 | 10/2019 |

OTHER PUBLICATIONS

Klaus Eisner, European International Searching Authority, International Search Report and Written Opinion, corresponding PCT Application No. PCT/US2020/057570, mailed Mar. 1, 2021, 11 pages total.

* cited by examiner

RADIATION SYSTEM FOR CONTROLLING BURSTS OF PULSES OF RADIATION

CROSS REFERENCE TO RELATED APPLICATION

This application claims priority to U.S. Application No. 62/933,140, filed Nov. 8, 2019 and titled RADIATION SYSTEM FOR CONTROLLING BURSTS OF PULSES OF RADIATION, which is incorporated herein in its entirety by reference.

FIELD

This disclosure relates to systems and methods for generating bursts of pulses of radiation for use, for example, in a lithographic apparatus. In particular, it may, for example, relate to systems and methods which generate a burst of pulses of radiation which switch between different wavelengths of radiation within the burst.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable the creation of increasingly smaller features. To project a pattern on a substrate, a lithographic apparatus may use electromagnetic radiation. The wavelength of this radiation determines the minimum size of features which are patterned into the resist on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Generally, an excimer laser is designed to operate with a specific gas mixture; therefore, changing wavelength can be complicated. In particular, changing the centre wavelength from one discharge to the next ("pulse-to-pulse") is challenging. There may be instances, however, where it is desired to have the ability to change wavelength. For example, in 3D NAND tiers of memory (that is, memory in which the structure resembles NAND ("NOT-AND") gates stacked on top of each other). The transition from 2D to 3D NAND architecture requires significant changes in manufacturing processes. In 3D NAND fabrication the challenges are driven primarily by the processes of etching and deposition at extreme aspect ratios (i.e. the ratio of a hole diameter to its depth). Creating complex 3D structures with very high-aspect-ratio (HAR) features is complicated and requires extreme precision and, ultimately, process uniformity and repeatability to achieve scale. Moreover, as multi-layered stack heights increase, so does the difficulty in achieving consistent etch and deposition results at the top and the bottom of the stack, e.g., a memory array.

These considerations lead to a need for a greater depth of focus. Lithography depth of focus DOF, for single-wavelength light, is determined by the relationship $DOF=\pm m_2 \lambda/(NA)^2$ where $\lambda$ is the wavelength of the illuminating light, NA is numerical aperture, and $m_2$ is a practical factor depending on the resist process. Due to greater depth-of-focus requirements in 3D NAND lithography, sometimes more than one exposure pass is made over a wafer using a different laser wavelength for each pass.

In addition, the materials making up the lenses that focus the laser radiation are dispersive so different wavelengths come to focus at different depths in the resist. This is another reason why it may be desirable to have the ability to change wavelengths.

A radiation system, such as a deep ultraviolet (DUV) radiation system, includes systems for controlling the wavelength of generated radiation. These wavelength control systems may include feedback and feed-forward compensators to promote wavelength stability. Characteristically it is expected that the target or reference wavelength, that is, the wavelength commanded by the wavelength control system, will not change rapidly during laser operation. The compensators may therefore be primarily engaged in rejecting transient disturbances. In an application of generating DUV light at two different wavelengths, the reference wavelength may have two set points during exposure, that is, a first set point at a first wavelength and a second set point at a second wavelength. The reference wavelength may be modulated between these two set points.

It may be desirable to provide a system and method for generation of pulses of radiation having a controlled characteristic, such as wavelength, which at least partially addresses one or more problems associated with known systems and methods, whether identified herein or otherwise.

SUMMARY

According to a first aspect there is provided a radiation system for controlling bursts of pulses of radiation comprising: an optical element configured to interact with the pulses of radiation to control a characteristic of the pulses of radiation, the characteristic of the pulses of radiation being dependent on a configuration of the optical element; a controller operable to generate a control signal; an actuator configured to receive the control signal from the controller and to control a configuration of the optical element in dependence on the control signal; and a sensor operable to determine the characteristic of pulses having interacted with the optical element; wherein the control signal for a given pulse in a given burst is dependent on the determined characteristic of a corresponding pulse from at least one previous burst.

The radiation system according to the first aspect is advantageous, as now discussed. The radiation system contains a feedback loop using the determined characteristic (for example wavelength) of pulses having interacted with the optical element from at least one previous burst. In particular, the control signal for a given pulse in a given burst may be given by a control sign that is dependent on the control signals for one or more corresponding pulses from a previous burst plus a feedback correction. The feedback correction may be dependent on (for example proportional to) a difference between the determined characteristic of the corresponding pulse(s) from the previous burst(s) and a nominal or target characteristic for the corresponding pulse from the previous burst. Advantageously, this allows the radiation system to account for, and at least partially correct, transient effects caused by different control signals being used during each burst of pulses and in between successive pair of bursts of pulses. Such transient effects could be significant, particularly if the dynamic response of the actuator and optical element system are underdamped.

The control signal for the given pulse in the given burst may be dependent on the determined characteristic of a set of pulses from at least one previous burst.

The set of pulses may comprise a plurality of pulses. The set of pulses from at least one previous burst may, for example, be a set of corresponding pulses from the at least one previous burst. It will be appreciated that for each pulse in a burst there may be one pulse in each previous burst that exactly corresponds to that pulse. For example, the 10th pulse in a given burst may exactly correspond to the 10th pulse in each other burst. For a given pulse in a given burst, a corresponding set of pulses from a previous burst may comprise the pulse from the previous burst which exactly corresponds to the given pulse plus, in addition, one or more surrounding pulses from the previous burst. For example, for the 10th pulse in a given burst the corresponding set of pulses from a previous burst may include the 9th, 10th and 11th pulse from the previous burst.

The control signal for a given pulse in a given burst may be given by the control signal for a corresponding pulse in at least one previous burst plus a correction term. The correction term may be dependent on the determined characteristic of the corresponding pulse from at least one previous burst. In this way, the feed-forward control signals for a given burst may contain a feed-back correction terms based on the previous burst(s).

The correction term may be proportional to a difference between the determined characteristic of the corresponding pulse from at least one previous burst and a nominal value of the characteristic.

For example, the determined characteristic may be the wavelength of the radiation. The correction term for a given pulse in a given burst may be proportional to a difference between a measured wavelength and a nominal or target wavelength for a corresponding pulse in the previous burst. For embodiments wherein the control signal for a given pulse in a given burst is dependent on the determined characteristic of a corresponding pulse from more than one previous burst, the correction term for that pulse may, for example, be a weighted sum of the differences between the measured wavelengths for the corresponding pulses in each previous burst and the nominal or target wavelength.

The correction term may be proportional to a gain. The gain may be equal to a first gain for any pulse which is not the first pulse in a burst and the gain may be equal to a second gain for any pulse which is the first pulse in a burst.

Advantageously, in this way, different gains may be applied for transients that occur within each burst and transients which occur due to a gap between successive bursts.

The characteristic may be a wavelength of the pulses of radiation.

The controller may be configured such that the control signal oscillates.

With such an arrangement, the radiation system may produce bursts of pulses of radiation whereby the characteristic (for example the wavelength) of the pulses oscillates. Advantageously, using multiple (for example, two) different wavelengths may be beneficial for use in a lithography system to increase depth of focus.

The actuator may comprise a piezoelectric element configured to rotate the optical element so as to control an angle of incidence of the pulses of radiation on the optical element.

The optical element may comprises a grating configured to reflect the pulses of radiation in a wavelength dependent manner such that a selected band of wavelengths of radiation are transmitted to an output of the radiation system.

The optical element may comprise a prism configured to refract the pulses of radiation in a wavelength dependent manner such that a selected band of wavelengths of radiation are transmitted to the output of the radiation system.

The control signal for a given pulse in a first burst may be determined based on a model of dynamics of the optical element and the actuator.

According to a second aspect there is provided a lithographic system comprising: a radiation system for controlling bursts of pulses of radiation, the radiation system comprising: an optical element configured to interact with the pulses of radiation to control a characteristic of the pulses of radiation, the characteristic of the pulses of radiation being dependent on a configuration of the optical element; a controller operable to generate a control signal; an actuator configured to receive the control signal from the controller and to control a configuration of the optical element in dependence on the control signal; and a sensor operable to determine the characteristic of pulses having interacted with the optical element; wherein the control signal for a given pulse in a given burst is dependent on the determined characteristic of a corresponding pulse from at least one previous burst; and a lithographic apparatus configured to receive pulses of radiation from the radiation system, pattern the pulses of radiation and project the patterned pulses of radiation onto a target.

According to a third aspect there is provided a method of controlling bursts of pulses of radiation comprising: using an optical element to interact with the pulses of radiation to control a characteristic of the pulses of radiation; determining the characteristic of pulses having interacted with the optical element; generating a control signal; and controlling a configuration of the optical element in dependence on the control signal; wherein the control signal for a given pulse in a given burst is dependent on the determined characteristic of a corresponding pulse from at least one previous burst.

The method according to the third aspect may be implemented using the radiation system according to the first aspect. The method uses a feedback loop using the determined characteristic (for example wavelength) of pulses having interacted with the optical element from previous bursts. In particular, the control signal for a given pulse in a given burst may be given by the control signal for the corresponding pulse from a previous burst plus a feedback correction. The feedback correction may be dependent on (for example proportional to) a difference between the determined characteristic of the corresponding pulse from the previous burst and a nominal or target characteristic for the corresponding pulse from the previous burst. Advantageously, this allows the method to account for, and at least partially correct, transient effects caused by different control signals being used during each burst of pulses and in between successive pair of bursts of pulses. Such transient effects could be significant, particularly if the dynamic response of the actuator and optical element system are underdamped.

The control signal for the given pulse in the given burst may be dependent on the determined characteristic of a set of pulses from at least one previous burst.

The control signal for a given pulse in a given burst may be given by the control signal for a corresponding pulse in a previous burst plus a correction term, the correction term being dependent on the determined characteristic of the corresponding pulse from at least one previous burst.

In this way, the feed-forward control signals for a given burst may contain a feed-back correction terms based on the previous burst.

The correction term may be proportional to a difference between the determined characteristic of the corresponding pulse from at least one previous burst and a nominal value of the characteristic.

For example, the determined characteristic may be the wavelength of the radiation. The correction term for a given pulse in a given burst may be proportional to a difference between a measured wavelength and a nominal or target wavelength for a corresponding pulse in the previous burst.

The correction term may be proportional to a gain. The gain may be equal to a first gain for any pulse which is not the first pulse in a burst and the gain may be equal to a second gain for any pulse which is the first pulse in a burst.

Advantageously, in this way, different gains may be applied for transients that occur within each burst and transients which occur due to a gap between successive bursts.

The characteristic may be a wavelength of the at least one pulse of radiation.

The generated control signal may oscillate.

With such an arrangement, the radiation system may produce bursts of pulses of radiation whereby the characteristic (for example the wavelength) of the pulses oscillates. Advantageously, using multiple (for example, two) different wavelengths may be beneficial for use in a lithography system to increase a depth of focus.

The control signal for a given pulse in a first burst may be determined based on a model of dynamics of the optical element and the actuator.

BRIEF DESCRIPTION OF THE DRAWINGS

Various versions of systems and methods will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
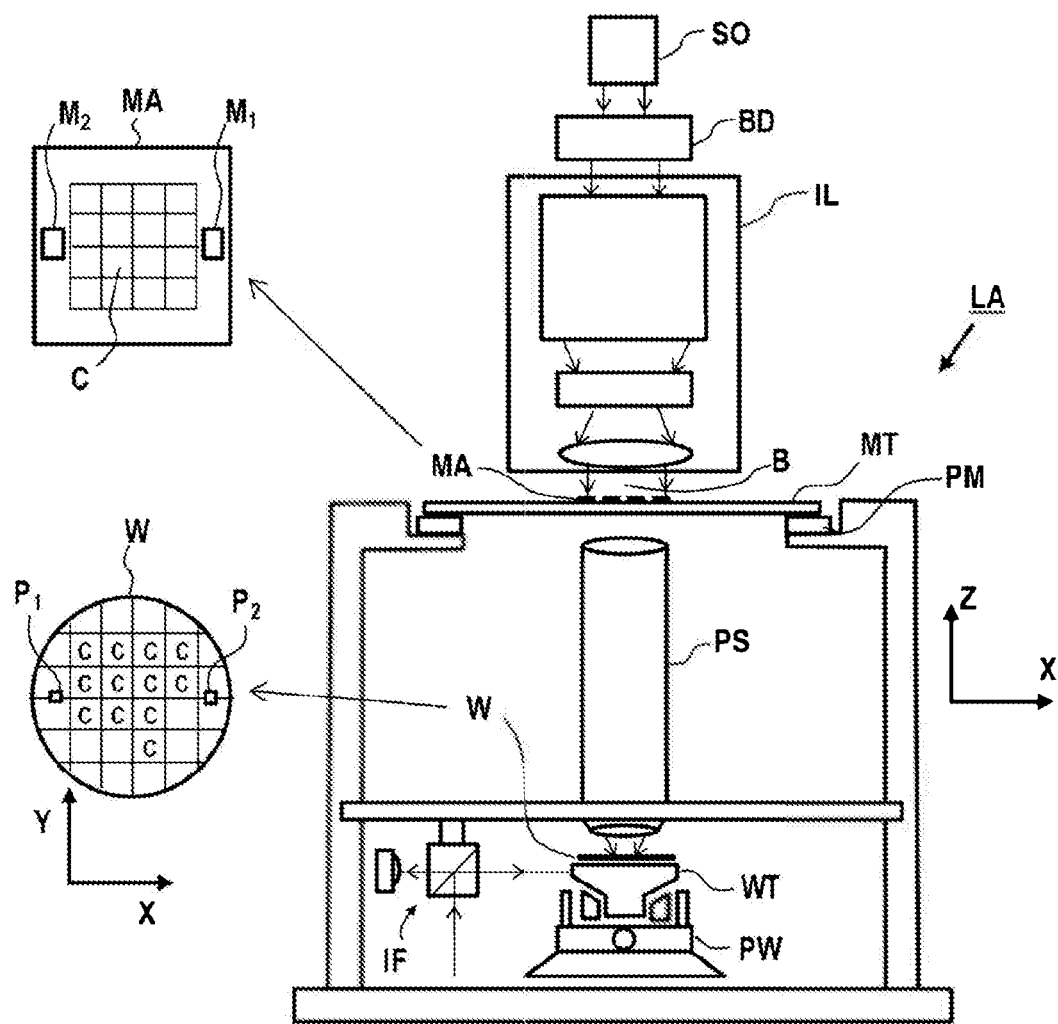
FIG. 1 schematically depicts an overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machines, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. a mask MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around the z-axis is referred to as an Rz-rotation. The z-axis may be generally coincident with an optical axis of the lithographic apparatus (for example in a vertical direction in FIG. 1) whereas the x-axis and the y-axis may define a plane perpendicular to the optical axis (for example a horizontal plane in FIG. 1). The Cartesian coordinate system does not limit the invention and is used for clarification only. Instead, another coordinate system, such as a cylindrical coordinate system, may be used to clarify. The orientation of the Cartesian coordinate system may be different, for example, such that the z-axis has a component along the horizontal plane.

Figure 2:
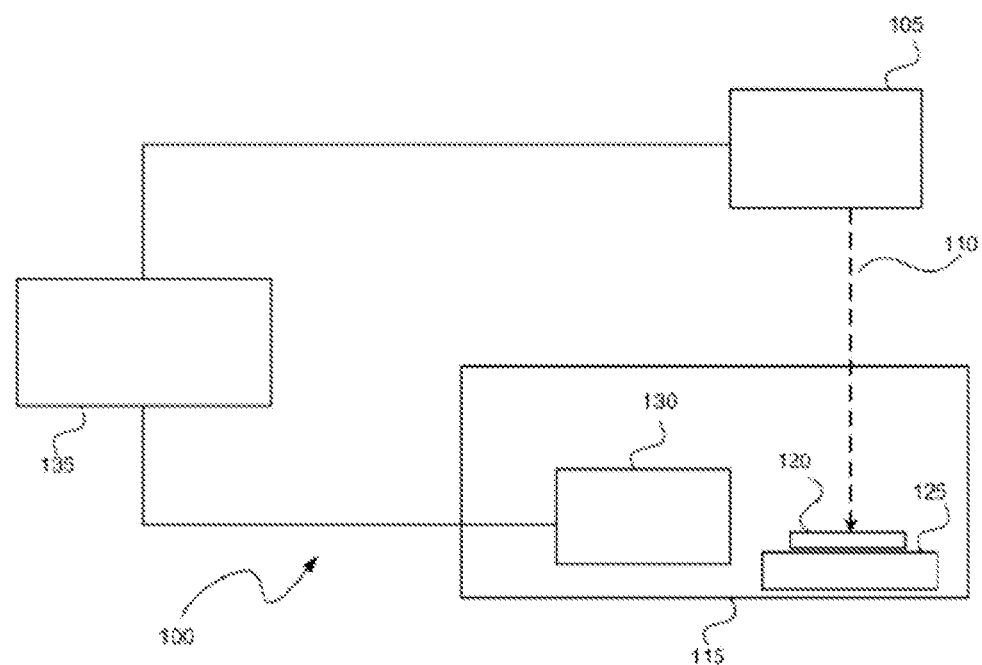
FIG. 2 schematically depicts a view of an overall broad conception of a photolithography system according to an aspect of the disclosed subject matter.

FIG. 2 schematically depicts a photolithography system 100 which includes an illumination system 105. As described more fully below, the illumination system 105 includes a light source that produces a pulsed light beam 110 and directs it to a photolithography exposure apparatus or scanner 115 that patterns microelectronic features on a wafer 120. The wafer 120 is placed on a wafer table 125 constructed to hold the wafer 120 and connected to a positioner configured to accurately position the wafer 120 in accordance with certain parameters.

The photolithography system 100 uses a light beam 110 having a wavelength in the deep ultraviolet (DUV) range, for example, with wavelengths of 248 nanometres (nm) or 193 nm. The minimum size of the microelectronic features that can be patterned on the wafer 120 depends on the wavelength of the light beam 110, with a lower wavelength permitting a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy of the light beam 110 is distributed over different wavelengths. The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120 based on, for example, the mask used, as well as other factors that affect the exposure. During lithography, a plurality of pulses of the light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 135 can also include one or more input devices (such as a keyboard, touch screen, microphone, mouse, hand-held input device, etc.) and one or more output devices (such as a speaker or a monitor). The control system 135 also includes one or more programmable processors, and one or more computer program products tangibly embodied in a machine-readable storage device for execution by one or more programmable processors. The one or more programmable processors can each execute a program of instructions to perform desired functions by operating on input data and generating appropriate output. Generally, the processors receive instructions and data from the memory. Any of the foregoing may be supplemented by, or incorporated in, specially designed ASICs (application-specific integrated circuits). The control system 135 can be centralized or be partially or wholly distributed throughout the photolithography system 100.

Figure 3:
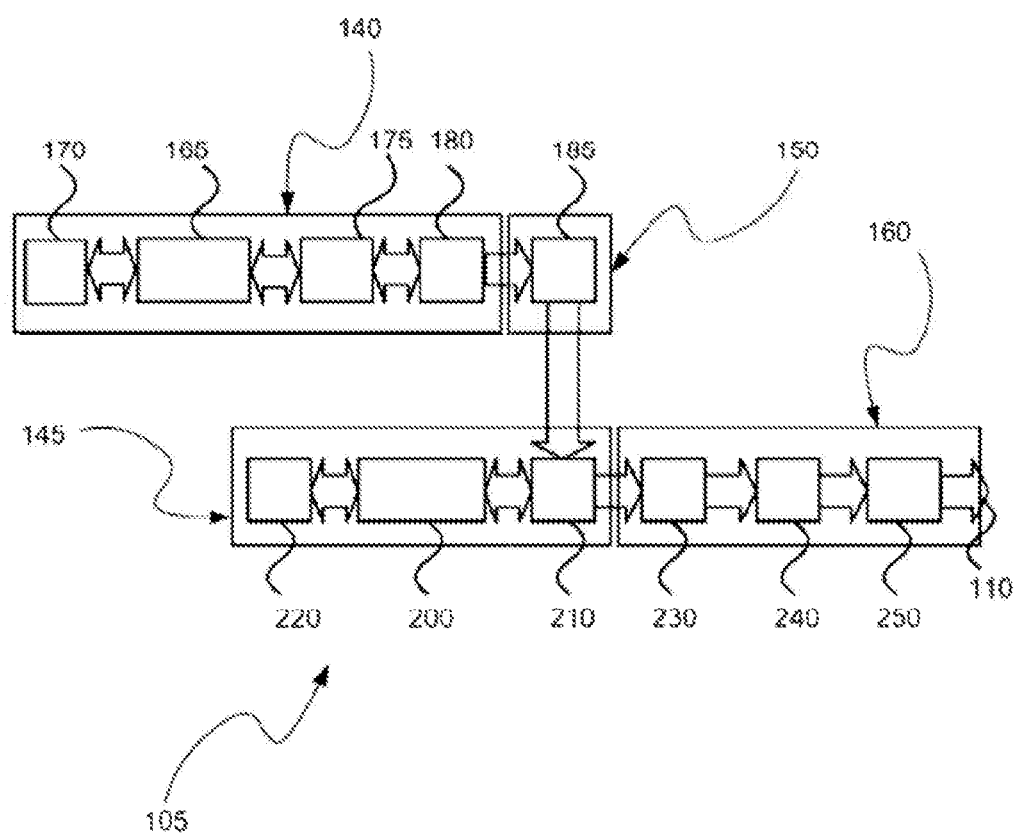
FIG. 3 schematically depicts a view of an overall broad conception of an illumination system according to an aspect of the disclosed subject matter.

Referring to FIG. 3, an exemplary illumination system 105 is a pulsed laser source that produces a pulsed laser beam as the light beam 110. FIG. 3 shows illustratively and in block diagram a gas discharge laser system according to an embodiment of certain aspects of the disclosed subject matter. The gas discharge laser system may include, e.g., a solid state or gas discharge seed laser system 140, an amplification stage, e.g., a power ring amplifier ("PRA") stage 145, relay optics 150 and laser system output subsystem 160. The seed system 140 may include, e.g., a master oscillator ("MO") chamber 165.

The seed laser system 140 may also include a master oscillator output coupler ("MO OC") 175, which may comprise a partially reflective mirror, formed with a reflective grating (not shown) in a line narrowing module ("LNM") 170, an oscillator cavity in which the seed laser 140 oscillates to form the seed laser output pulse, i.e., forming a master oscillator ("MO"). The system may also include a line-centre analysis module ("LAM") 180. The LAM 180 may include an etalon spectrometer for fine wavelength measurement and a coarser resolution grating spectrometer. A MO wavefront engineering box ("WEB") 185 may serve to redirect the output of the MO seed laser system 140 toward the amplification stage 145, and may include, e.g., beam expansion with, e.g., a multi prism beam expander (not shown) and coherence busting, e.g., in the form of an optical delay path (not shown).

The amplification stage 145 may include, e.g., a PRA lasing chamber 200, which may also be an oscillator, e.g., formed by seed beam injection and output coupling optics (not shown) that may be incorporated into a PRA WEB 210 and may be redirected back through the gain medium in the chamber 200 by a beam reverser 220. The PRA WEB 210 may incorporate a partially reflective input/output coupler (not shown) and a maximally reflective mirror for the nominal operating wavelength (e.g., at around 193 nm for an ArF system) and one or more prisms.

A bandwidth analysis module ("BAM") 230 at the output of the amplification stage 145 may receive the output laser light beam of pulses from the amplification stage and pick off a portion of the light beam for metrology purposes, e.g., to measure the output bandwidth and pulse energy. The laser output light beam of pulses then passes through an optical pulse stretcher ("OPuS") 240 and an output combined autoshutter metrology module ("CASMM") 250, which may also be the location of a pulse energy meter. One purpose of the OPuS 240 may be, e.g., to convert a single output laser pulse into a pulse train. Secondary pulses created from the original single output pulse may be delayed with respect to each other. By distributing the original laser pulse energy into a train of secondary pulses, the effective pulse length of the laser can be expanded and at the same time the peak pulse intensity reduced. The OPuS 240 can thus receive the laser beam from the PRA WEB 210 via the BAM 230 and direct the output of the OPuS 240 to the CASMM 250. Other suitable arrangements may be used in other embodiments.

The PRA lasing chamber 200 and the MO 165 are configured as chambers in which electrical discharges between electrodes may cause lasing gas discharges in a lasing gas to create an inverted population of high energy molecules, including, e.g., Ar, Kr, and/or Xe, to produce relatively broad band radiation that may be line narrowed to a relatively very narrow bandwidth and centre wavelength selected in a line narrowing module ("LNM") 170, as is known in the art.

Typically the tuning takes place in the LNM. A typical technique used for line narrowing and tuning of lasers is to provide a window at the back of the laser's discharge cavity through which a portion of the laser beam passes into the LNM. There, the portion of the beam is expanded with a prism beam expander and directed to an optical element, such as a grating which reflects a narrow selected portion of the laser's broader spectrum back into the discharge chamber where it is amplified. The laser is typically tuned by changing the angle at which the beam illuminates the grating using an actuator such as, for example, a piezoelectric actuator. Alternatively a transmissive optical element, such as a prism may be used to transmit a narrow selected portion of the laser's broader spectrum back into the discharge chamber where it is amplified. The laser may be tuned by changing the angle at which the beam illuminates the prism using an actuator such as, for example, a piezoelectric actuator.

As set forth above, for some applications it is beneficial to be able to generate a burst of one or more pulses having one wavelength and then be able to switch to generating a burst of one or more pulses having a different wavelength. Switching wavelengths between pulses, however, is challenging. One reason is that the settling time, that is, the amount of time it takes the system to stabilize after a wavelength change, is typically longer than the interpulse interval. According to one aspect, the transient settling period caused by changing the reference wavelength is shortened by preparing the actuator by pre-positioning the actuator between bursts to achieve an upcoming new target wavelength between bursts.

According to another aspect, a dynamic model of the actuator is used to compute an optimal control waveform for actuating the actuator to minimize the difference between actual wavelength and wavelength targets.

The optimal control waveform can be computed using any one of several methods. For example, the optimal control waveform may be computed using dynamic programming. This method is well adapted for dealing with complex models that contain nonlinear dynamics. If an actuator model is adopted that has strong nonlinear dynamics, then dynamic programming may be used to generate the optimal control signal for given wavelength targets. Dynamic programming does, however, present the challenge that it requires significant computational resources which may not be implementable in real-time. To overcome this challenge a data storage device such as a pre-populated look-up-table or a pre-programmed field programmable gate array (FPGA) may be used which contains optimal control parameters for at least some of the different repetition rates at which the source may be operated.

As another example, the optimal control waveform may be determined using model inversion feedforward control. This method relies on the actuator dynamic model to construct a digital filter that inverts the actuator dynamic. By passing the desired waveform for the desired actuator trajectory through this filter, an optimal control waveform can be generated in real time to achieve zero steady state error tracking.

As another example, an optimal solution to achieve two separate wavelengths in a stable manner is accomplished using a learning algorithm to guarantee error convergence over several iterations of learning.

Embodiments of the systems and methods disclosed herein can potentially achieve two separate wavelengths separated by 1000 fm with a separation error below 20 fm.

According to another aspect, the optimal control waveform may be fed to the actuator at a very high rate by using a FPGA.

Figure 4:
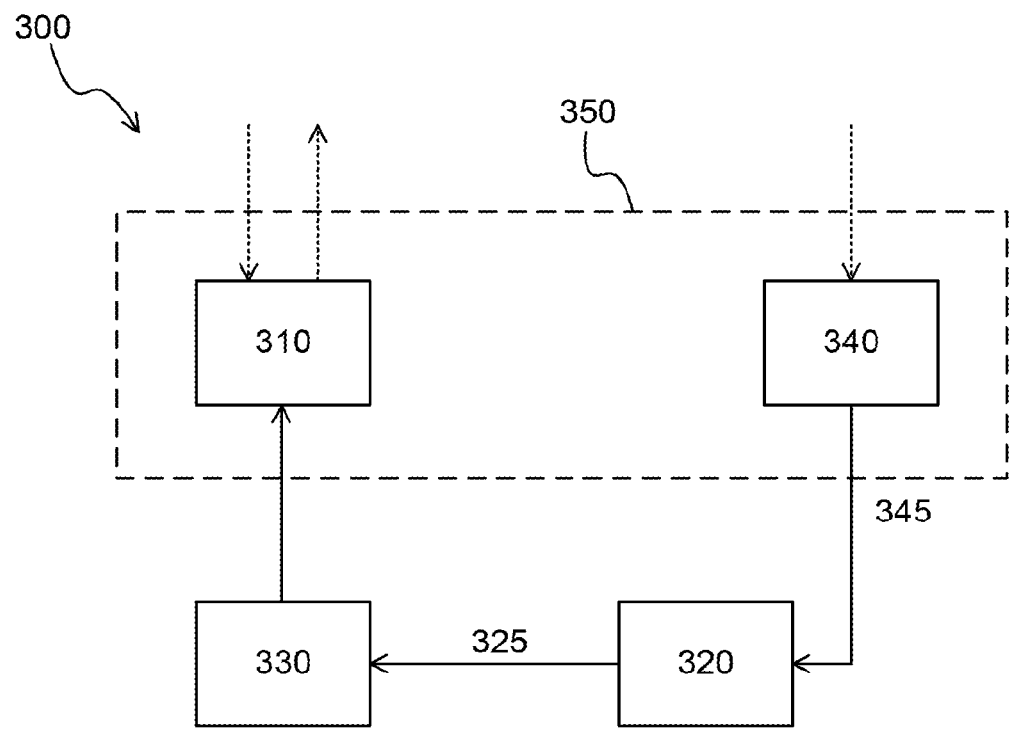
FIG. 4 is a schematic representation of a radiation system for controlling bursts of pulses of radiation.

FIG. 4 is a schematic representation of a radiation system 300 for controlling bursts of pulses of radiation. The radiation system 300 may form at least part of the illumination system 105 shown in FIG. 3 and described above. The radiation system 300 may incorporate any of the features of the illumination system 105 shown in FIG. 3. The radiation system 300 comprises: an optical element 310; a controller 320; an actuator 330; and a sensor 340.

The optical element 310 is configured to interact with the pulses of radiation (indicated schematically by dotted arrows) to control a characteristic of the pulses of radiation (for example a wavelength of the pulses of radiation). The characteristic of the pulses of radiation may be dependent on a configuration of the optical element 310. The optical element 310 may comprise one or more parts of the line narrowing module ("LNM") 170 described above with reference to FIG. 3. The optical element 310 may comprise a reflective grating configured to reflect the pulses of radiation in a wavelength dependent manner such that a selected band of wavelengths of radiation are transmitted to an output of the radiation system 300. Additionally or alternatively, the optical element 310 may comprise a prism configured to refract the pulses of radiation in a wavelength dependent manner such that a selected band of wavelengths of radiation are transmitted to the output of the radiation system 300.

The sensor 340 is operable to determine the characteristic (for example wavelength) of pulses having interacted with the optical element 310. For example, the sensor 340 may comprise, or may form part of, a line-centre analysis module ("LAM") 180 of the type shown in FIG. 3 and described above. The sensor 340 may include an etalon spectrometer for fine wavelength measurement and a coarser resolution grating spectrometer but it will be appreciated that other sensors may be used.

The optical element 310 and the sensor 340 both form part 350 of the radiation system 300 that is operable to physically interact with the pulses of radiation (as indicated schematically by dotted arrows). This part 350 of the radiation system 300 therefore provides a physical interface between the other parts of radiation system 300, and the pulses of radiation.

The controller 320 is operable to generate a control signal 325. In turn, the actuator 330 is configured receive the control signal 325 from the controller 320 and to control a configuration of the optical element 310 in dependence on the control signal 325. The actuator 330 may comprise a piezoelectric element configured to rotate the optical element 310 so as to control an angle of incidence of the pulses of radiation on the optical element 310.

In use, a plurality of bursts of pulses of radiation is generated. For example, the bursts of pulses of radiation may be generated using an illumination system 105 of the form shown in FIG. 3 and described above. Each pulse of radiation interacts with the optical element 310 and, in so doing, the optical element 310 influences the characteristic (for example the wavelength) of each pulse. Subsequently, the characteristic of each pulse (which has been determined by the optical element 310) is measured by the sensor 340, which also interacts with each pulse of radiation.

The controller 320 is configured such that the control signal 325 for a given pulse in a given burst is dependent on the determined characteristic of at least one corresponding pulse from at least one previous burst. That is, a part of the control signal 325 which influences the position of the optical element 310 (via actuator 330) for a given pulse in a given burst, is dependent on the determined characteristic of a corresponding pulse from to least one previous burst, as discussed further below. The control signal 325 may comprise a feed-forward signal for each pulse in each burst.

As described further below, the control signal 325 updates for every burst of pulses. However, within any given burst of pulses the characteristic (for example wavelength) of the pulses may be controlled in an open-loop scheme.

Figure 5:
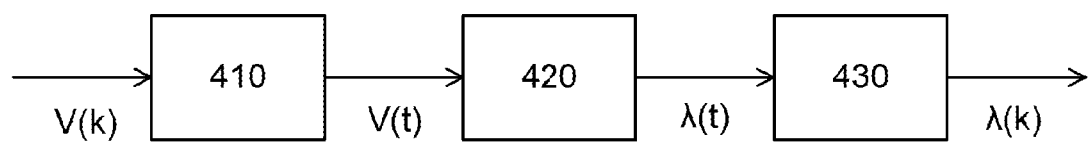
FIG. 5 is a schematic illustration of the control over the wavelength of pulses within the radiation system shown in FIG. 4.

The control over the wavelength of pulses within the radiation system 300 is now discussed with reference to FIG. 5.

A first input into the control of the radiation system 300 may comprise a plurality of voltages V(k), V(k) being a feed-forward signal for a voltage which is to be applied to the actuator 330 for the kth pulse. That is to say, V(k) may represent a voltage which is to be applied to the actuator 330 so as to control the position of the optical element 310 when the kth pulse within a burst is incident on the optical element 310. Optionally, these voltages V(k) may be converted into a time-dependent waveform V(t) using an analogue-to-digital converter 410. This waveform V(t) may be applied by the actuator 330 so as control the optical element 310. It will be appreciated that when sampled by the pulses interacting with the optical element 310 this waveform V(t) may reduce to the plurality of voltages V(k) and any suitable interpolation between the pulses may be used to generate the waveform V(t).

The control signal 325 generated by the controller 320 may be considered to comprise plurality of voltages V(k). Additionally or alternatively, the control signal 325 generated by the controller 320 may be considered to comprise the waveform V(t).

In turn, application of the time-dependent waveform V(t) to the actuator 330 results in a time-dependent output wavelength λ(t) which can be output by a sub-system 420 of the radiation system 300. The response of the sub-system 420 determines the time-dependent output wavelength λ(t) based on the time-dependent waveform V(t). The response of the sub-system 420 may be considered to depend on an analog low-pass-filter, a response of the actuator 330 to the input voltage V(t) (which response may or may not, for example, be generally linear) and/or any optics gains which result from the pulses interacting with the optical element 310.

The time-dependent output wavelength λ(t) is then sampled by the pulses 430 of radiation which may be incident on the optical element 310 at a repetition rate so as to produce discrete output wavelengths λ(k), wherein output wavelength λ(k) is the wavelength of the kth pulse.

In some embodiments of the illumination system 300, the illumination system 300 may be configured such that an output pulsed light beam comprises a train of pulses wherein a wavelength of the pulses alternates between two different set-point wavelengths. That is, such that odd pulses have a first set-point wavelength and even pulses have a second set-point wavelength. In order to achieve this, the controller 320 may be configured such that the control signal 325 oscillates, for example at a frequency equal to half the repetition rate of the pulses of radiation. For example, the time-dependent waveform V(t) applied by the actuator 330 so as control the optical element 310 may be periodic and may oscillate with a frequency equal to half the repetition rate of the pulses of radiation (or an integer multiple thereof). With such an arrangement, the radiation system may produce bursts of pulses of radiation whereby the wavelength of the pulses oscillates. Advantageously, using multiple (for example, two) different wavelengths may be beneficial for use in a lithography system to increase a depth of focus, as described above.

Different parts of the radiation system 300 may operate at different frequencies or repetition rates.

For example, the sensor 340 may be operable to determine the characteristic of each pulse of radiation. Therefore, the sensor 340 may be operable to acquire data, and output it as an output signal 345 to the controller 320, at a frequency given by a repetition rate of the radiation system 300. The repetition rate of the radiation system 300 may be, for example, of the order of 6 kHz.

In order for the wavelength of the pulses to oscillate from pulse to pulse, the actuator 330 may also operate at a frequency that depends on the repetition rate of the radiation system 300. For example, the actuator may move once between each pair of successive pulses in order to achieve the oscillating output wavelength. With such an arrangement the time-dependent waveform V(t) (see FIG. 5) may be generally of the form of a square wave or a sinusoidal wave. Alternatively, the actuator 330 may operate at a frequency that is higher than the repetition rate of the radiation system 300. For example, the actuator 330 may operate at 10 times, or 15 times, the repetition rate of the radiation system 300. With such an arrangement, the actuator 330 may move multiple times (for example 10 times or 15 times) between each pair of successive pulses in order to achieve the oscillating output wavelength. With such an arrangement the time-dependent waveform V(t) (see FIG. 5) may be generally sinusoidal. By operating the actuator 330 at a higher frequency than the repetition rate of the radiation system 300, V(t) can excite $\lambda(t)$ at a frequency where the gain is higher and can thus increase the (pulse to pulse) separation seen by $\lambda(k)$. In general, the gain ratio $\lambda(t)/V(t)$ depends on a spectrum of the waveform V(t). Furthermore, in general, for a given power of the waveform V(t), a power of $\lambda(t)$ will be higher if V(t) has a higher frequency.

Figure 6:
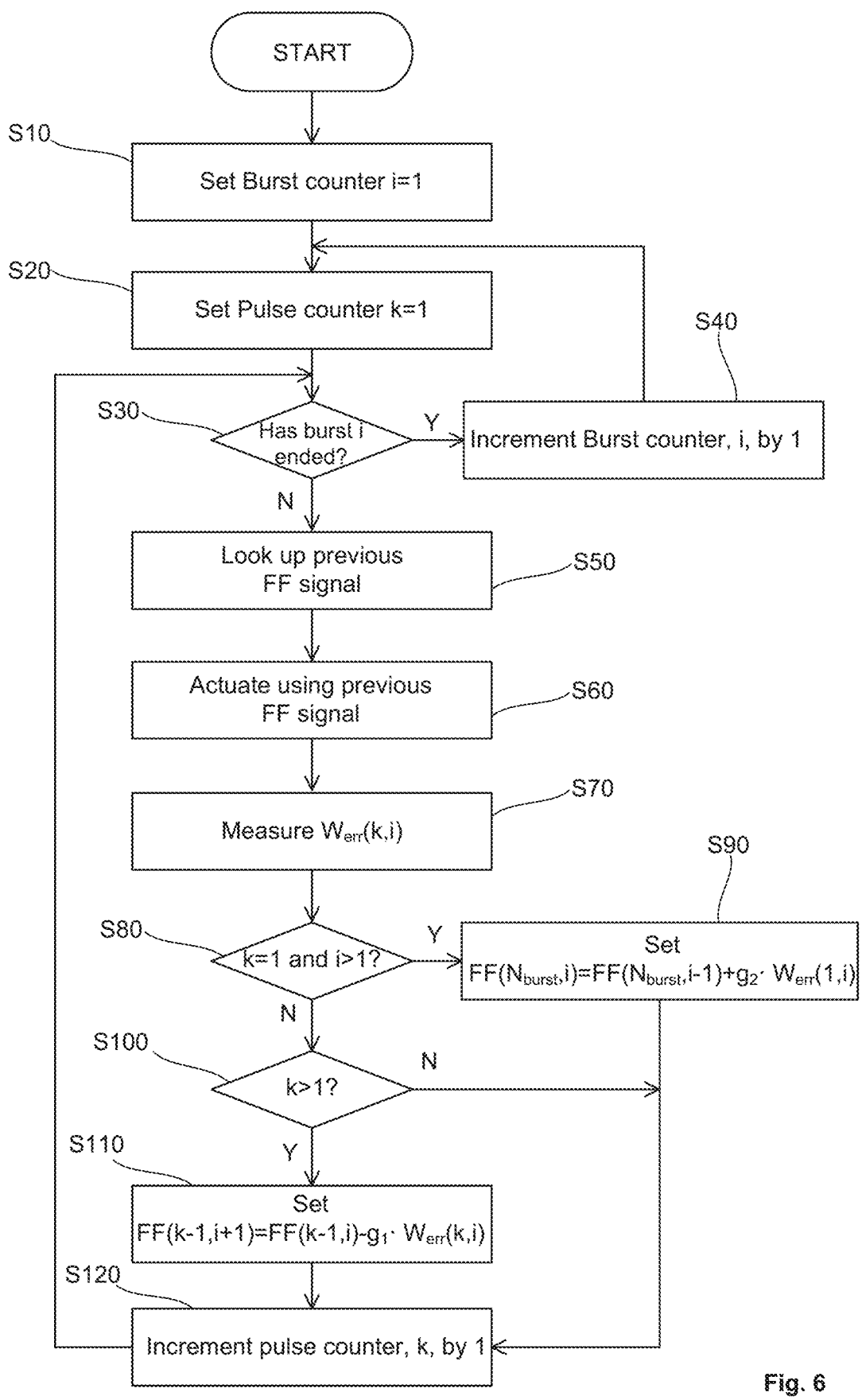
FIG. 6 shows a flowchart of a method for controlling bursts of pulses of radiation within the radiation system shown in FIG. 4.

In some embodiments, the control signal 325 for a given pulse in a given burst is dependent on the determined characteristic of a corresponding pulse from a previous burst, as now described with reference to FIG. 6. FIG. 6 shows a flowchart of a method for controlling bursts of pulses of radiation.

As a first step S10, a burst counter i is set to 1. The generation of a first burst of pulses then begins. At a second step S20, a pulse counter k for pulses within the current burst is set to 1. The generation of a first pulse in the current burst of pulses then begins.

At step S30 it is decided whether or not the current burst (burst i) has ended. For example, in some embodiments, a new burst may start when certain amount of time has passed since the last pulse, this is also known as "burst timeout". For such embodiments, step S30 may involve deciding whether or not the said certain amount of time has passed since the last pulse. Alternatively, step S30 may be achieved by deciding whether or not the pulse counter k for pulses within the current burst is greater than the total number of pulses in each burst, $N_{burst}$ (for example for embodiments where each burst has a certain number, $N_{burst}$ of pulses). If at step S30 it is determined that the current burst has ended, at step S40, the burst counter i is incremented by 1 and the method returns to step S20, ready to start generation of the pulses within the next burst.

If at step S30 it is determined that the current burst has not yet ended then then the generation of the current burst of pulses has not yet finished and so the method proceeds to the generation of the next pulse in the burst (steps S50 to S120, as now discussed).

At step S50, a previous feed-forward signal FF is obtained. This previous FF signal will be used for the generation of the kth pulse in the ith burst. This previous feed-forward signal FF may, for example, be retrieved from a look-up table or some other memory within the controller 320. During generation of the first pulse in the first burst, the previous feed-forward signal FF may be set to a default value. Subsequently, the previous feed-forward signal FF is defined as follows. During generation of the first pulse in a burst (i.e. when k=0), the previous feed-forward signal FF is signal $FF(N_{burst},i-1)$, i.e. the feed-forward signal for the $N_{burst}$th pulse in the (i−1)th burst. During generation of a pulse which is not the first pulse in a burst (i.e. when k≠0), the previous feed-forward signal FF is signal $FF(k-1,i)$, i.e. the feed-forward signal for the (k−1)th pulse in the ith burst.

At step S60, the previous feed-forward signal FF is used to actuate the optical element 310 during generation of the kth pulse in the ith burst. For example, the voltage V(k) to be applied to the actuator 330 when the kth pulse in this burst is incident on the optical element 310 is dependent on this previous feed-forward signal FF. The voltage V(k) to be applied to the actuator 330 may, for example, be proportional to (for example equal to) the previous feed-forward signal FF. As discussed above with reference to FIG. 5, the voltage V(k) may first be converted into a time-dependent voltage waveform V(t) that is applied to the actuator 330.

At step S70, a wavelength error $W_{err}(k,i)$ for the kth pulse in the ith burst is determined (i.e. a wavelength error for the pulse currently being generated). This wavelength error $W_{err}(k,i)$ is determined from a wavelength $\lambda(k,i)$ determined by the sensor 340 and a target or nominal wavelength. In particular, the wavelength error $W_{err}(k,i)$ is determined as a difference between the wavelength $\lambda(k,i)$ determined by the sensor 340 and the target or nominal wavelength.

Next, the method proceeds to step S80.

At step S80, if the current pulse being generated is the first pulse in the burst (i.e. k=1) and the current burst is not the first burst to be generated (i.e. i>1), the method proceeds to step S90 where the feed-forward signal for the last pulse (the $N_{burst}$th pulse) in the current burst is set according to the following equation:

$$FF(N_{burst},i) = FF(N_{burst},i-1) + g_2 \cdot W_{err}(1,i), \quad (1)$$

where $FF(N_{burst},i)$ is the feed-forward signal for the last pulse (the $N_{burst}$th pulse) in the current burst, $FF(N_{burst},i-1)$ is the feed-forward signal for the last pulse (the $N_{burst}$th pulse) in the previous burst, $g_2$ is a gain parameter and $W_{err}(1,i)$ is the wavelength error determined during the generation of the current (i.e. first) pulse of the current burst of pulses.

It will be appreciated that, as set out in equation (1), the feed-forward signal for the last pulse (the $N_{burst}$th pulse) in the current burst is set equal to the feed-forward signal for the last pulse (the $N_{burst}$th pulse) in the previous burst plus a correction term. It will be appreciated that $FF(N_{burst},i)$, which is the feed-forward signal for the last pulse (the $N_{burst}$th pulse) in the current burst, will actually be used (see steps S50 and S60) subsequently for the generation of the first pulse in the (i+1)th burst. Similarly, $FF(N_{burst},i-1)$, which is the feed-forward signal for the last pulse (the $N_{burst}$th pulse) in the previous burst, has just been used (see steps S50 and S60) for the generation of the 1st pulse in the current (ith) burst. The correction term is dependent on the wavelength error $W_{err}(1,i)$ determined during the err, generation of the current (i.e. first) pulse of the current burst of pulses.

Note that, as shown in the flowchart of FIG. 6, the feed-forward signal for the last pulse in the current burst, $FF(N_{burst},i)$, (which will actually be used, see steps S50 and S60, subsequently for the generation of the 1st pulse in the (i+1)th burst) is set at step S90, once $W_{err}(k,i)$ has been measured. In general, however, the feed-forward signal for the last pulse in the current burst, $FF(N_{burst},i)$, may be set according to equation (1) at any time after $W_{err}(k,i)$ has been measured and before the generation of the next burst begins. For example, in some embodiments it may be that $N_{burst}$ is not known until the generation of the current burst has ended (for example if the next burst starts when a certain amount of time has passed since the last pulse). For such embodiments, the feed-forward signal for the last pulse in the current burst, $FF(N_{burst},i)$, may be set immediately before or immediately after step S40.

Once the feed-forward signal for the last pulse (the $N_{burst}$th pulse) in the current burst has been set at step S90, the method proceeds to step S120.

At step S80, if the current pulse being generated is not the first pulse in the burst (i.e. k≠1) or the current burst is the first burst to be generated (i.e. i=1), the method proceeds to step S100.

At step S100, if the current pulse being generated is not the first pulse in the burst (i.e. k>1) the method proceeds to step S110; otherwise the method proceeds to step S120. Note that this path directly from step S100 to step S120 will only be used during generation of the first pulse in the first burst.

At step S110, the feed-forward signal for the (k−1)th pulse in the next burst, i.e. the (i+1)th burst, is set according to the following equation:

$$FF(k-1,i+1)=FF(k-1,i)-g_1 \cdot W_{err}(k,i), \quad (2)$$

where $FF(k-1,i+1)$ is the feed-forward signal for the (k−1)th pulse in the next burst, $FF(k-1,i)$ is the feed-forward signal for the (k−1)th pulse in the current burst, $g_1$ is a gain parameter and $W_{err}(k,i)$ is the wavelength error determined during the generation of the current (i.e. kth) pulse of the current burst of pulses.

It will be appreciated that in this way, the feed-forward signal for all pulses in the next burst can be set equal to the feed-forward signal for the corresponding pulse in the current burst plus a correction term. The correction term is dependent on the determined wavelength of the corresponding pulse from the current burst. Here, as given by equation (2), the correction term for the feed-forward the feed-forward signal for the (k−1)th pulse is proportional to the wavelength error determined during the generation of the current (i.e. kth) pulse (recall that the feed-forward signal for the (k−1)th pulse will actually be used for generation of the kth pulse).

At step S120, the pulse counter k is incremented by 1 and the method returns to step S30, ready to start generation of the next pulse.

In this way, all of the feed-forward signals (which correspond to the signal 325 output by the controller 320) for each pulse in all bursts except for the first burst are set equal to the feed-forward control signal for the corresponding pulse in the previous burst plus a correction term. The correction term is proportional to a difference between the determined wavelength of the corresponding pulse from the previous burst and a nominal value of the characteristic.

As will be discussed further below (with reference to FIG. 8), methods for controlling bursts of pulses of radiation the generally of the type described above with reference to FIG. 6 may allow the voltage waveform (as defined by the feed-forward control signals) to converge towards a steady state waveform over a certain number of bursts of pulses. Therefore, it may be that once this steady state has been reached, during the generation of subsequent pulses, the method may simply use these steady state values rather than calculating correction terms based on the wavelength errors in previous pulses. For example, at control step S30 (see FIG. 6), the method may determine whether or not a given number of bursts of pulses has already be generated (this number generally being sufficiently large such that the voltage waveform should have already converged to a steady state waveform, for example given number of bursts of pulses may be 20. For example, at or around step S30 the method may determine whether or not i≤20. If so (i.e. i≤20), the method may proceed as described above using steps S40-S120. However, if not (i.e. i>20) then the method may implement a simpler set of steps whereby, for example, only steps S40 and S50 are implemented (selecting and using the relevant stored feed-forward signal to generate a pulse), following which the method may proceed directly to step S120 (ready for generation of the next pulse). Optionally, the measurement of the wavelength error at step S70 may be performed and the information may be stored for later analysis.

In the above-described example (as schematically represented in FIG. 6), the feed-forward signals for each pulse in all bursts except for the first burst are set equal to the feed-forward control signal for the corresponding pulse in the previous burst plus a correction term. In the described example, the correction term (see equations (1) and (2)) is proportional to a difference between the determined wavelength of the corresponding pulse from the previous burst and a nominal wavelength. Therefore, this described example may be considered to be a one-burst look back scenario, wherein a correction is applied based on the wavelength error for the corresponding pulse in a single previous burst. However, in alternative embodiments the control signal 325 may depend on several or all previous bursts. This may be referred to as an n-burst look back scenario.

Furthermore, in the above the above-described example (as schematically represented in FIG. 6), only the feed forward-signal and the wavelength error for the single corresponding pulse in the previous burst are used to define the feed-forward signal for a given pulse in a given burst. However, in alternative embodiments, more than one corresponding pulse in the previous burst(s) may be used. For example, in addition to the pulse from the previous burst(s) which exactly corresponds to the current pulse, one or more surrounding pulses may also be used. In general, the correction term may be dependent on the wavelength error for a set of corresponding pulses in the previous burst(s), wherein the set of corresponding pulses may comprise a plurality of corresponding pulses.

In general, the feed-forward signals may be determined using all measurement history of the wavelength errors $W_{err}(k,i)$. For example, in general, equations (1) and (2) may be replaced with:

$$FF(k,i)=f(FF(1,2,\ldots,N_{burst};1,2,\ldots,i-1),W_{err}(1,2,\ldots,N_{burst};1,2,\ldots,i-1)), \quad (3)$$

where f is any function of the feed-forward signals for the previous bursts $FF(1,2,\ldots,N_{burst};1,2,\ldots,i-1)$ and the wavelength errors $W_{err}(1,2,\ldots,N_{burst};1,2,\ldots,i-1)$ for pulses in previous bursts.

The inventors of the present invention have realized that in a radiation-generating regime where the wavelength target changes within a burst (e.g. every pulse) a new burst transient appears in the system. The reason for this is that, as explained above, the actuator 330 and optical element 310 have to be put in an oscillatory state in order to change the wavelength every pulse, however, this physical system of actuator 330 and optical element 310 returns to quiescent during an inter-burst interval between successive bursts of radiation. In short, the actuator 330 voltage waveforms that should be used to (a) start an oscillation quickly; and (b) maintain the oscillation are different.

Figure 7A:
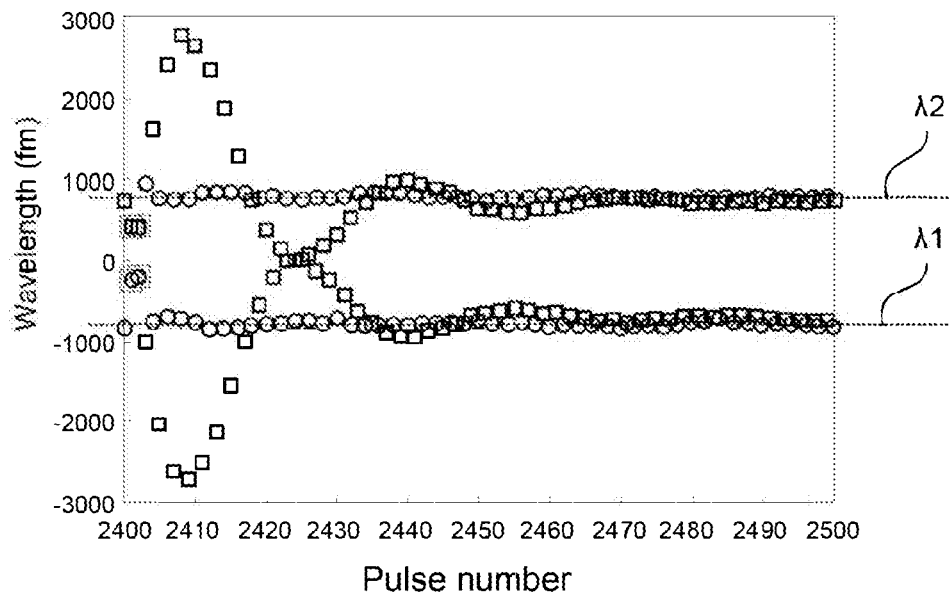
FIG. 7A shows the wavelength for each pulse an open loop control regime (squares) and an adapted control regime (circles) which is more suited to operation whereby the wavelength varies from pulse to pulse (also referred to as a multi-focal imaging regime)
Figure 7B:
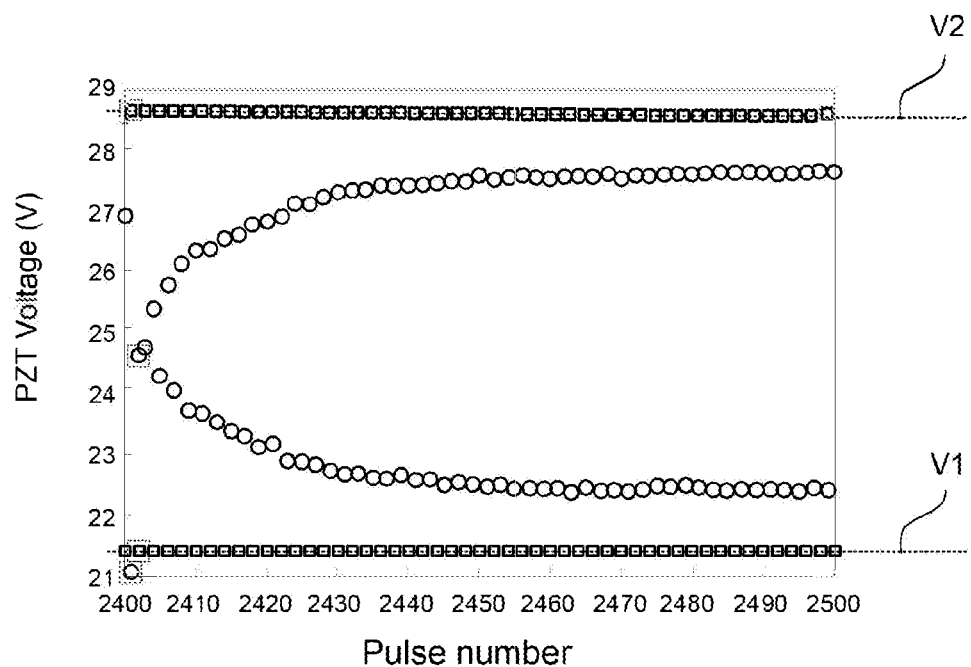
FIG. 7B shows the control voltage applied to an actuator for each pulse in an open loop control regime and an adapted control regime which is more suited to operation whereby the wavelength varies from pulse to pulse (also referred to as a multi-focal imaging regime)

This is illustrated in FIGS. 7A and 7B, which compares an open loop control regime (represented by squares) and an adapted control regime (represented by circles) which is more suited to operation whereby the wavelength varies from pulse to pulse (also referred to as a multi-focal imaging regime). FIGS. 7A and 7B show, respectively, the wavelength for each pulse and the control voltage applied to the actuator 330 for each pulse.

As shown in FIG. 7B, the open loop control applies a control voltage which alternates between the same two set-point voltages, V1, V2. As can be seen in FIG. 7A, at least at the start of each burst of radiation (here, the current burst started at pulse number 2400), under this control regime the wavelengths tend to overshoot and transiently oscillate about the nominal or target set-point values $\lambda 1$, $\lambda 2$.

As shown in FIG. 7B, the adapted control regime applies a control voltage which alternates but wherein the magnitude of this oscillation increases over an initial time period. As can be seen in FIG. 7A, under this control regime the wavelengths tend to converge on the nominal or target set-point values $\lambda 1$, $\lambda 2$ significantly quicker than the open loop control regime does.

All of the feed-forward signals (which correspond to the signal 325 output by the controller 320) for each pulse in all bursts except for the first burst are set equal to the feed-forward control signal for the corresponding pulse in the previous burst plus a correction term. Note that, although the correction term is proportional to a difference between the determined wavelength of the corresponding pulse from the previous burst and a nominal value of the characteristic, a different gain ($g_2$) is used for the first pulse in the burst and for all other pulses ($g_1$). Advantageously, in this way, different gains may be applied for transients that occur within each burst and transients which occur due to a gap between successive bursts.

The radiation system 300 is advantageous since it contains a feedback loop using the determined characteristic (for example wavelength) of pulses having interacted with the optical element 310 from previous bursts. In particular, the control signal 325 for a given pulse in a given burst may be given by the control signal 325 for the corresponding pulse from a previous burst plus a feedback correction. The feedback correction may be dependent on (for example proportional to) a difference between the determined characteristic of the corresponding pulse from the previous burst and a nominal or target characteristic for the corresponding pulse from the previous burst. Advantageously, this allows the radiation system 300 to account for, and at least partially correct, transient effects caused by different control signals being used during each burst of pulses and in between successive pair of bursts of pulses. Such transient effects could be significant, particularly if the dynamic response of the actuator and optical element system are underdamped.

Although the general shape of the transient behavior may be known and may, for example, be modelled. In practice, it is difficult to model this behavior sufficiently accurately to keep wavelength errors within acceptable limits.

Figure 8:
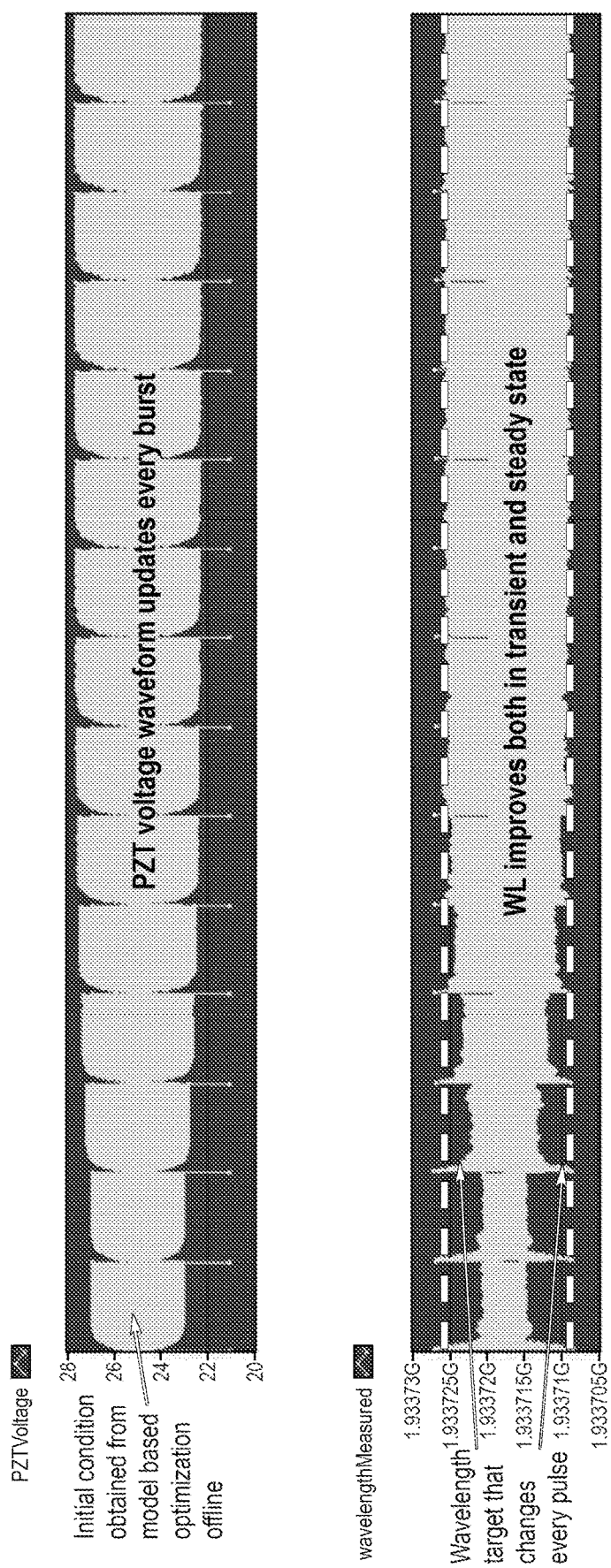
FIG. 8 shows the control voltage applied to an actuator as a function of pulse number (upper plot) and the wavelength for each pulse (lower plot) for the control scheme shown in FIG. 6 and show the two plots spanning 15 bursts of pulsed of radiation.

FIG. 8 shows the control voltage applied to the actuator 330 as a function of pulse number (upper plot) and the wavelength for each pulse (lower plot). These results are shown for the control scheme described above with reference to FIG. 6 and show the two plots spanning 15 bursts of pulsed of radiation.

It can be seen that an initial control scheme for the first burst of pulses of radiation is generally of the form of the adapted control regime described above with reference to FIGS. 7A and 7B. The voltage waveform for the initial burst of pulses may, for example, have been determined by a suitable model. Although generally of the correct "adapted" form, it will be appreciated from FIG. 8 that there are still significant wavelength errors present.

However, using the control scheme described above with reference to FIG. 6, it can be seen that over a few bursts of pulses, the voltage waveform converges towards steady state waveform and that, in doing so, the wavelength accuracy is improved both in the transient and the steady state.

The feed-forward signals for the first burst of pulses may be determined based on a model of the dynamics of the optical element 310 and the actuator 330. For example, in order to account for constraints on the change of actuator 330 voltage, quadratic programming with constraints may be used to help find the optimal feed-forward signal within the feasible region of operation. Quadratic programming (QP) is a technique that finds the optimal solution to a given quadratic cost function with constraints mathematically. In the techniques being described here, the objective is to find the feed-forward control that satisfies the actuator 330 constraints while minimizing the error between actuator position and the desired control waveform.

Alternatively, the initial condition can be that the feed-forward signals for the first burst of pulses are set to zero (although such embodiments may take longer to converge to a steady state).

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Implementations of the disclosure may further be described using the following clauses:

1. A radiation system for controlling bursts of pulses of radiation comprising:
   an optical element configured to interact with the pulses of radiation to control a characteristic of the pulses of radiation, the characteristic of the pulses of radiation being dependent on a configuration of the optical element;
   a controller operable to generate a control signal;
   an actuator configured to receive the control signal from the controller and to control a configuration of the optical element in dependence on the control signal; and
   a sensor operable to determine the characteristic of pulses having interacted with the optical element;
   wherein the control signal for a given pulse in a given burst is dependent on the determined characteristic of a corresponding pulse from at least one previous burst.
2. The radiation system of clause 1 wherein the control signal for the given pulse in the given burst is dependent on the determined characteristic of a set of pulses from at least one previous burst.
3. The radiation system of clause 1 wherein the control signal for a given pulse in a given burst is given by the control signal for a corresponding pulse in at least one previous burst plus a correction term, the correction term being dependent on the determined characteristic of the corresponding pulse from at least one previous burst.
4. The radiation system of clause 3 wherein the correction term is proportional to a difference between the determined characteristic of the corresponding pulse from at least one previous burst and a nominal value of the characteristic.
5. The radiation system of clause 4 wherein the correction term is proportional to a gain, the gain being equal to a first gain for any pulse which is not the first pulse in a burst and the gain being equal to a second gain for any pulse which is the first pulse in a burst.
6. The radiation system of clause 1 wherein the characteristic is a wavelength of the pulses of radiation.
7. The radiation system of clause 1 wherein the controller is configured such that the control signal oscillates.
8. The radiation system of clause 7, wherein the control signal oscillates to provide pulses having wavelengths that alternate between two different set-point wavelengths, within a burst of the pulses.
9. The radiation system of clause 1, wherein the actuator comprises a piezoelectric element configured to rotate the optical element so as to control an angle of incidence of the pulses of radiation on the optical element.
10. The radiation system of clause 1, wherein the optical element comprises a grating configured to reflect the pulses of radiation in a wavelength dependent manner such that a selected band of wavelengths of radiation are transmitted to an output of the radiation system.
11. The radiation system of clause 1, wherein the optical element comprises a prism configured to refract the pulses of radiation in a wavelength dependent manner such that a selected band of wavelengths of radiation are transmitted to the output of the radiation system.
12. The radiation system of clause 1, wherein the control signal for a given pulse in a first burst is determined based on a model of dynamics of the optical element and the actuator.
13. The radiation system of clause 1, wherein the controller is configured such that the control signal provides pulses having wavelengths that alternate between two different set-point wavelengths, within a burst of the pulses.
14. A lithographic system comprising:
    a radiation system for controlling bursts of pulses of radiation, the radiation system comprising:
    an optical element configured to interact with the pulses of radiation to control a characteristic of the pulses of radiation, the characteristic of the pulses of radiation being dependent on a configuration of the optical element;
    a controller operable to generate a control signal;
    an actuator configured to receive the control signal from the controller and to control a configuration of the optical element in dependence on the control signal; and
    a sensor operable to determine the characteristic of pulses having interacted with the optical element;
    wherein the control signal for a given pulse in a given burst is dependent on the determined characteristic of a corresponding pulse from at least one previous burst; and
    a lithographic apparatus configured to receive pulses of radiation from the radiation system, pattern the pulses of radiation and project the patterned pulses of radiation onto a target.
15. The lithographic system of clause 14 wherein the controller is configured such that the control signal oscillates to provide pulses having wavelengths that alternate between two different set-point wavelengths, within a burst of the pulses.
16. The lithographic system of clause 15 wherein the lithographic apparatus is configured to receive the pulses having wavelengths that alternate between the two different set-point wavelengths.
17. A method of controlling bursts of pulses of radiation comprising:
    using an optical element to interact with the pulses of radiation to control a characteristic of the pulses of radiation;

determining the characteristic of pulses having interacted with the optical element;
generating a control signal; and
controlling a configuration of the optical element in dependence on the control signal;
wherein the control signal for a given pulse in a given burst is dependent on the determined characteristic of at least a corresponding pulse from at least one previous burst.

18. The method of clause 17 wherein the control signal for the given pulse in the given burst is dependent on the determined characteristic of a set of pulses from at least one previous burst.

19. The method of clause 17 wherein the control signal for a given pulse in a given burst is given by the control signal for a corresponding pulse in a previous burst plus a correction term, the correction term being dependent on the determined characteristic of the corresponding pulse from at least one previous burst.

20. The method of clause 19 wherein the correction term is proportional to a difference between the determined characteristic of the corresponding pulse from at least one previous burst and a nominal value of the characteristic.

21. The method of clause 19 wherein the correction term is proportional to a gain, the gain being equal to a first gain for any pulse which is not the first pulse in a burst and the gain being equal to a second gain for any pulse which is the first pulse in a burst.

22. The method of clause 17, wherein the characteristic is a wavelength of the at least one pulse of radiation.

23. The method of clause 17, wherein the generated control signal oscillates.

24. The method of clause 17, wherein the control signal for a given pulse in a first burst is determined based on a model of dynamics of the optical element and the actuator.

25. The method of clause 17, wherein the generated control signal oscillates to provide pulses having wavelengths that alternate between two different set-point wavelengths.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A radiation system for controlling bursts of pulses of radiation comprising:
   an optical element configured to interact with the pulses of radiation to control a wavelength of the pulses of radiation, the wavelength of the pulses of radiation being dependent on a configuration of the optical element;
   a controller operable to generate a control signal;
   an actuator configured to receive the control signal from the controller and to control a configuration of the optical element in dependence on the control signal; and
   a sensor operable to determine the wavelength of pulses having interacted with the optical element;
   wherein the control signal for a given pulse in a given burst is dependent on the determined wavelength of a corresponding pulse from at least one previous burst and wherein the control signal oscillates to provide pulses having wavelengths that alternate between two different set-point wavelengths, within a burst of the pulses.

2. The radiation system of claim 1 wherein the control signal for the given pulse in the given burst is dependent on the determined wavelength of a set of pulses from at least one previous burst.

3. The radiation system of claim 1 wherein the control signal for a given pulse in a given burst is given by the control signal for a corresponding pulse in at least one previous burst plus a correction term, the correction term being dependent on the determined wavelength of the corresponding pulse from at least one previous burst.

4. The radiation system of claim 3 wherein the correction term is proportional to a difference between the determined wavelength of the corresponding pulse from at least one previous burst and a nominal value of the wavelength.

5. The radiation system of claim 4 wherein the correction term is proportional to a gain, the gain being equal to a first gain for any pulse which is not the first pulse in a burst and the gain being equal to a second gain for any pulse which is the first pulse in a burst.

6. The radiation system of claim 1, wherein the actuator comprises a piezoelectric element configured to rotate the optical element so as to control an angle of incidence of the pulses of radiation on the optical element.

7. The radiation system of claim 1, wherein the optical element comprises a grating configured to reflect the pulses of radiation in a wavelength dependent manner such that a selected band of wavelengths of radiation are transmitted to an output of the radiation system.

8. The radiation system of claim 1, wherein the optical element comprises a prism configured to refract the pulses of radiation in a wavelength dependent manner such that a selected band of wavelengths of radiation are transmitted to the output of the radiation system.

9. The radiation system of claim 1, wherein the control signal for a given pulse in a first burst is determined based on a model of dynamics of the optical element and the actuator.

10. A lithographic system comprising:
    a radiation system for controlling bursts of pulses of radiation, the radiation system comprising:
    an optical element configured to interact with the pulses of radiation to control a wavelength of the pulses of radiation, the wavelength of the pulses of radiation being dependent on a configuration of the optical element;
    a controller operable to generate a control signal;
    an actuator configured to receive the control signal from the controller and to control a configuration of the optical element in dependence on the control signal; and
    a sensor operable to determine the wavelength of pulses having interacted with the optical element;
    wherein the control signal for a given pulse in a given burst is dependent on the determined wavelength of a corresponding pulse from at least one previous burst; and
    a lithographic apparatus configured to receive pulses of radiation from the radiation system, pattern the pulses of radiation and project the patterned pulses of radiation onto a target, and wherein the controller is configured such that the control signal oscillates to provide pulses having wavelengths that alternate between two different set-point wavelengths, within a burst of the pulses.

11. The lithographic system of claim 10 wherein the lithographic apparatus is configured to receive the pulses having wavelengths that alternate between the two different set-point wavelengths.

12. A method of controlling bursts of pulses of radiation comprising:

using an optical element to interact with the pulses of radiation to control a wavelength of the pulses of radiation;

determining the wavelength of pulses having interacted with the optical element;

generating a control signal; and controlling a wavelength of the optical element in dependence on the control signal;

wherein the control signal for a given pulse in a given burst is dependent on the determined wavelength of at least a corresponding pulse from at least one previous burst, and wherein the generated control signal oscillates to provide pulses having wavelengths that alternate between two different set-point wavelengths.

13. The method of claim 12 wherein the control signal for the given pulse in the given burst is dependent on the determined wavelength of a set of pulses from at least one previous burst.

14. The method of claim 12 wherein the control signal for a given pulse in a given burst is given by the control signal for a corresponding pulse in a previous burst plus a correction term, the correction term being dependent on the determined wavelength of the corresponding pulse from at least one previous burst.

15. The method of claim 14 wherein the correction term is proportional to a difference between the determined wavelength of the corresponding pulse from at least one previous burst and a nominal value of the wavelength.

16. The method of claim 14 wherein the correction term is proportional to a gain, the gain being equal to a first gain for any pulse which is not the first pulse in a burst and the gain being equal to a second gain for any pulse which is the first pulse in a burst.

17. The method of claim 12, wherein the control signal for a given pulse in a first burst is determined based on a model of dynamics of the optical element and the actuator.

* * * * *